(12) United States Patent
Hamaoka et al.

(10) Patent No.: US 7,217,955 B2
(45) Date of Patent: May 15, 2007

(54) SEMICONDUCTOR LASER DEVICE

(75) Inventors: Osamu Hamaoka, Yamsiotajoacia (JP); Hiroshi Nakatsu, Mihara (JP); Hideki Ichikawa, Shild-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 274 days.

(21) Appl. No.: 10/968,213

(22) Filed: Oct. 20, 2004

(65) Prior Publication Data

US 2005/0082550 A1 Apr. 21, 2005

(30) Foreign Application Priority Data

Oct. 21, 2003 (JP) ............................. 2003-360434
Aug. 31, 2004 (JP) ............................. 2004-252532

(51) Int. Cl.
*H01L 27/15* (2006.01)
(52) U.S. Cl. ..................... 257/80; 257/81; 257/83; 257/84; 372/43.01; 372/50.21
(58) Field of Classification Search ..................... None
See application file for complete search history.

(56) References Cited

U.S. PATENT DOCUMENTS 5,543,352 A 8/1996 Ohtani et al.
6,072,607 A * 6/2000 Tajiri et al. .................. 359/15
2005/0047460 A1 * 3/2005 Go et al. ....................... 372/43
2005/0082550 A1 * 4/2005 Hamaoka et al. .............. 257/80

FOREIGN PATENT DOCUMENTS

| CN | 1111398 A | | 11/1995 |
|---|---|---|---|
| JP | 7-161634 A | | 6/1995 |
| JP | 2001-267676 A | * | 9/2001 |
| JP | 2001-345507 A | * | 12/2001 |
| JP | 2002-124468 A | | 4/2002 |
| JP | 2002-313804 A | | 10/2002 |
| JP | 2003-100633 A | | 4/2003 |

* cited by examiner

*Primary Examiner*—Leonardo Andujar
*Assistant Examiner*—Scott R Wilson
(74) *Attorney, Agent, or Firm*—Nixon & Vanderhye P.C.

(57) ABSTRACT

A semiconductor laser device includes a one-body submount composed of a predetermined material such as SiC or AlN and placed on a mounting surface. A laser diode is placed on a front portion of an upper surface of the submount. A monitoring photodiode composed of crystalline silicon is stacked on a portion of the upper surface of the submount backward from the laser diode.

16 Claims, 9 Drawing Sheets

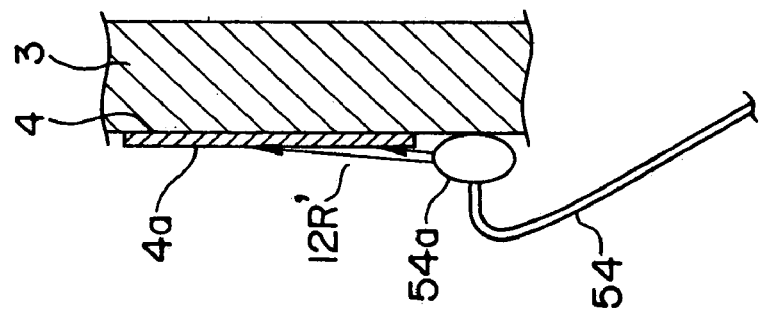
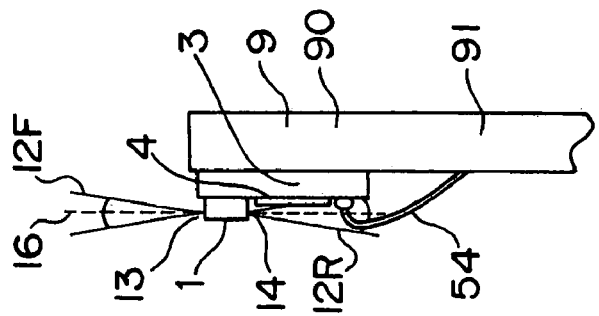
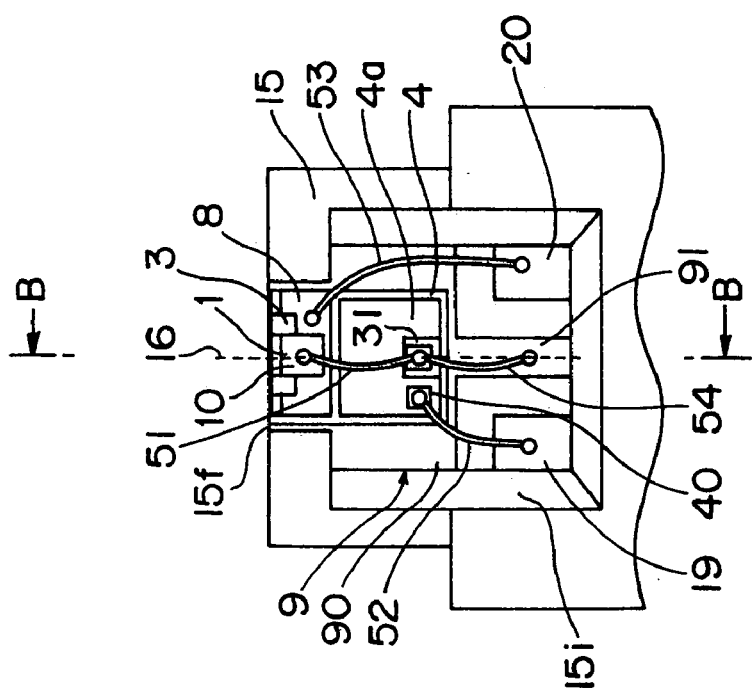

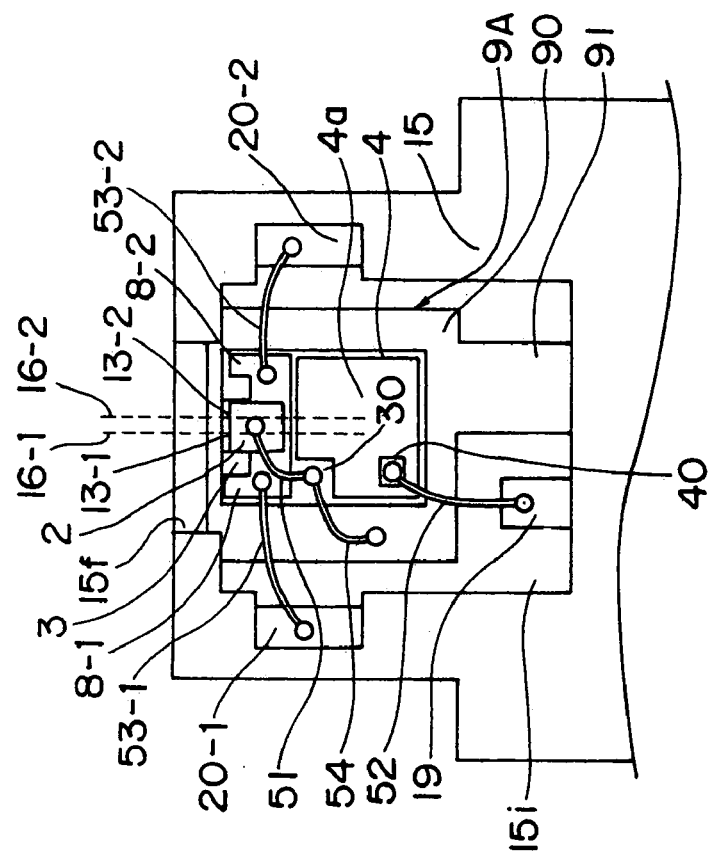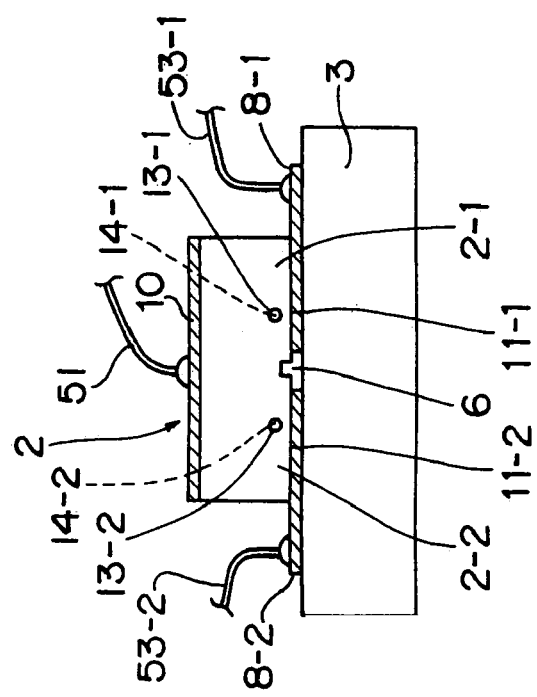

SEMICONDUCTOR LASER DEVICE

CROSS-REFERENCE TO RELATED APPLICATIONS

This nonprovisional application claims priority under 35 U.S.C. §119(a) on Patent Application No. 2003-360434 filed in Japan on 21 Oct. 2003 and No. 2004-252532 on 31 Aug. 2004, the entire contents of which are incorporated herein by reference.

BACKGROUND OF THE INVENTION

The present invention relates to a semiconductor laser device, and more particularly to a semiconductor laser device in which a laser diode and a photodiode for monitoring an output of the laser diode are mounted on a mounting surface such as a stem. This type of semiconductor laser device is used, for example, as a component constructing a recording/reproducing device for CDs (compact discs), videodiscs, DVDs (Digital Versatile Discs) and so on.

Conventionally, a monitor submount type shown in FIGS. 6A and 6B are known as this type of semiconductor laser device (for example, JP 2001-267676A). FIG. 6A is a view of a laser diode seen from a direction perpendicular to a mounting surface thereof. FIG. 6B is a schematic cross section of the laser diode taken along line B—B of FIG. 6A (the same as in FIGS. 7A and 7B described below). The semiconductor laser device is constructed as follows. On a heat release block (heat sink) 115, there is mounted a rectangular parallelepiped Si (silicon) substrate 110 as a submount, in a surface of which a photodiode 104 is formed. Further, a laser diode 101 is mounted on a laser diode mounting electrode 109 formed on the surface of the silicon substrate 110. Reference numerals 105A, 105B and 105C respectively denote metal wires connected to a rear surface electrode (for simplicity, the wires are omitted in FIG. 6B). The laser diode 101 emits light forward (upward in FIGS. 6A and 6B) and backward (downward in FIGS. 6A and 6B). The laser light emitted forward (forward emitted light) is applied to an optical disc to be recorded/reproduced, while the laser light emitted backward (backward emitted light) is photoelectrically converted into a monitoring signal by the photodiode 104. The monitoring signal is used for controlling the output of the laser diode 101 by a control circuit not shown.

However, this semiconductor laser device has the submount composed of the Si substrate 110, where the thermal conductivity of Si is not so high (84 to 147 W/m·K) Therefore, the heat release characteristic (i.e. performance of releasing heat which the laser diode generates in operation) of the submount is not necessarily sufficient. There is a possibility that the laser diode 101 deteriorates in temperature characteristic or that the laser diode 101 is destructed due to thermal runaway.

Thus, another conventional semiconductor laser device is proposed as shown in FIGS. 7A and 7B (JP2001-345507A). This semiconductor laser device is constructed as follows. A rectangular parallelepiped Si (silicon) substrate 211, in a surface of which a photodiode 204 is formed, is mounted on a heat sink 215. In parallel to the substrate 211, there are mounted a separate rectangular parallelepiped submount 210 composed of an insulator such as AlN (aluminum nitride) and SiC (silicon carbide) having a large thermal conductivity. Further, a laser diode 201 is mounted on a laser diode mounting electrode 209A formed on a surface of the submount 210. The surface of the submount 210 is formed with another electrode 209B separated from the electrode 209A. Reference numerals 205A, 205B, 205C, 205D respectively denote metal wires (for simplicity, those are omitted in FIG. 7B). The submount 210 is improved in heat release characteristic (performance of releasing heat generated by the laser diode in operation) because the submount 210 is composed of a material having a large thermal conductivity such as AlN and SiC.

However, since the submount 210 on which the laser diode 201 is mounted and the Si substrate 211 formed with the photodiode 204 are separate from each other in this semiconductor laser device, the number of components increases, resulting in high cost.

Also, in order to stabilize monitoring signals outputted by the photodiode 204, the submount and the Si substrate must be accurately positioned in an assembling process and therefore manufacture is difficult.

Further, in order to make backward emitted light of the laser diode 201 be sufficiently incident on the photodiode 204, it is required that a thickness of the submount 210 (Hs) and a thickness of the Si substrate 211 (photodiode 204) (Hp) satisfy the condition Hs>Hp. Thus, accuracy in thickness is required. For that reason, manufacture is more difficult.

SUMMARY OF THE INVENTION

An object of the invention is therefore to provide a semiconductor laser device which has a good heat release characteristic and which is easily manufactured at low cost.

In order to achieve the object, the present invention provides a semiconductor laser device comprising:

a one-body submount composed of a predetermined material and placed on a mounting surface;

a laser diode placed on a front portion of an upper surface of the submount; and a monitoring photodiode composed of a crystalline silicon film and stacked on a portion of the upper surface of the submount backward from the laser diode.

The "mounting surface" herein means a generic term for a package member such as a substrate, a frame and a stem. The mounting surface is preferably flat. The reason therefor is that flatness of the mounting surface makes it easier to mount members thereon.

The "one-body" submount means that a submount is one component composed of a spatially continuous material. An external configuration of the submount is preferably of a rectangular parallelepiped shape for example. The reason therefor is that the external configuration of a rectangular parallelepiped shape can easily be formed.

The "laser diode" herein indicates a laser diode in a chip state.

The "front portion" of the submount is defined on the basis of a laser light-emitting direction of the laser diode. Specifically, the direction of laser light emitted from the laser diode to an irradiated object (e.g., an optical disc to be recorded/produced) is referred to as a "forward" direction. A forward region of the submount positioned on the upper surface thereof is referred to as a "front portion" of the submount.

The "crystalline silicon film" means a film composed of silicon having some crystallinity such as continuous grain silicon (referred to as CGS and also CG silicon) described in e.g. JP-7-161634A and polysilicon.

In the semiconductor laser device of this invention, laser light emitted forward from the laser diode is applied to the object such as an optical disc to be recorded/reproduced during operation (this laser light is referred to as "forward emitted light"). On the other hand, laser light emitted backward from the laser diode is applied to the monitoring photodiode (this laser light is referred to as "backward emitted light"). Light received by the monitoring photodiode is photoelectrically converted to monitoring signals, which are used for controlling an output of the laser diode.

In the semiconductor laser device of this invention, since the submount is a one-body component, the number of components decreases compared with the conventional embodiment shown in FIGS. 7A and 7B, resulting in manufacture at low cost. Further, the monitoring photodiode is composed of a crystalline silicon film which is formed at a backward portion of the upper surface of the submount. Therefore, positioning of the submount and the monitoring photodiode, which is conducted to stabilize monitoring signals, is not required in the assembly process. The reason therefor is that the crystalline silicon film is preliminarily stacked on a surface of the submount and accurately patterned in a wafer process before the assembly process. Thereby, manufacture of the semiconductor laser device becomes easy, and moreover, stable monitoring signals are obtained.

In the semiconductor laser device of the invention, the crystalline silicon film forming the monitoring photodiode is stacked on the submount. This means that it is unnecessary to form a monitoring photodiode in the submount, and also to adopt Si (silicon) generally used as a material of the submount. As a result, an electrically insulating material other than Si can be used as a submount material, which is a material having a larger thermal conductivity than Si, such as SiC (silicon carbide having a thermal conductivity of 270 W/m·K) and AlN (aluminum nitride having a thermal conductivity of 60–260 W/m·K). These materials improve heat release characteristic, that is, performance of releasing heat generated by the laser diode in operation, compared with that of the prior art shown in FIGS. 6A and 6B.

The heat generated by the laser diode in operation is radiated to the mounting surface through the submount. From the viewpoint of heat release, the mounting surface is preferably made of a metallic material such as a well-known heat sink.

In the semiconductor laser device of the invention, the monitoring photodiode is composed of crystalline silicon, and therefore dark current of the monitoring photodiode can be suppressed.

In one embodiment of the present invention, a light-receiving surface of the monitoring photodiode has a height less than a height of a light-emitting point of the laser diode with reference to the height of the mounting surface.

The "height of a light-receiving surface of the monitoring photodiode" and the "height of a light-emitting point of the laser diode" are determined as relative distances from the mounting surface (which may include a flat upper surface of the submount).

The "light-emitting point" of the laser diode means a point, from which laser light is emitted, of the end surface forming a resonator.

In one embodiment of the present invention, the light-receiving surface of the monitoring photodiode has a height less than the height of the light-emitting point of the laser diode, and therefore, backward emitted light of the laser diode is sufficiently incident on the light-receiving surface of the monitoring photodiode. Thus, more stable monitoring signals are obtained.

In one embodiment of the present invention, a relay electrode is placed on the upper surface of the submount away from the laser diode; and an upper electrode of the laser diode is connected to the relay electrode via a metal wire.

The "upper electrode" of the laser diode indicates an electrode placed on the upper side as a result that the laser diode is mounted on the submount, where the electrodes are placed on both sides of the laser diode.

According to the semiconductor laser device of this embodiment, when wiring the electrode of the laser diode in the assembly process, the upper electrode of the laser diode is connected to the relay electrode via a metal wire. Further, the relay electrode on the submount is connected to, for example, a lead electrode having the same height as the mounting surface via another metal wire. The upper surface of the submount has a height intermediate between the height of the upper surface of the laser diode and the height of the mounting surface and therefore a height difference between a first bonding position and a second bonding position of the metal wires is small. Therefore, wire bonding operation become easy and manufacture of the semiconductor laser device becomes easy.

In one embodiment of the present invention, the relay electrode is placed on a rear portion of the upper surface of the submount; and the metal wire is disposed along an optical axis of the laser diode in the front-rear direction.

According to the semiconductor laser device of this embodiment, part of the backward emitted light of the laser diode, which is not directly incident on the light-receiving surface of the monitoring photodiode, is reflected by portions of the metal wire in proximity of the relay electrode (i.e. by a surface of a ball formed at an edge of the wire and a surface of a curved portion of the wire), and incident on the light-receiving surface of the monitoring photodiode as reflected light. Thus, the amount of incident light increases, and more stable monitoring signals are obtained.

In one embodiment of the present invention, the submount is made of an electrically insulating material having a thermal conductivity larger than that of the crystalline silicon.

According to the semiconductor laser device of this embodiment, the material of the submount has a larger thermal conductivity than the crystalline silicon, and therefore the heat release characteristic of the submount is more improved than conventional one made of crystalline silicon. Further, when material of the submount is an electrical insulator, it becomes easy to electrically isolate the laser diode from the monitoring photodiode.

Material for the submount includes SiC (silicon carbide having a thermal conductivity of 270 W/m·K), AlN (aluminum nitride having a thermal conductivity of 60–260 W/m·K) and the like.

In one embodiment of the present invention, the front portion of the submount is provided with a laser diode mounting electrode having substantially the same dimension as the laser diode in the front-rear direction; and a lower electrode of the laser diode is connected to the laser diode mounting electrode via a brazing material.

The dimension of the laser diode in the front-rear direction corresponds to a dimension of the laser diode in the laser light-emitting direction of the laser diode, namely, a length of the resonator.

According to the semiconductor laser device of this embodiment, the laser diode mounting electrode has substantially the same dimension as the laser diode in the front-rear direction. Therefore, the forward emitted light and the backward emitted light are emitted without being interrupted by the laser diode mounting electrode. Therefore, the backward emitted light is stably converted to monitoring signals by the monitoring photodiode, while the forward emitted light is stably applied to an object (e.g., an optical disc to be recorded/reproduced).

In one embodiment of the present invention, the laser diode includes a plurality of chips that are separated from each other.

In one embodiment of the present invention, the laser diode includes a one-body chip having a plurality of light-emitting points.

In one embodiment of the present invention, the front portion of the submount is provided with a laser diode mounting electrode; and the laser diode is disposed on the laser diode mounting electrode in a state of junction down.

The "junction down" herein means that the laser diode including a light-emitting layer (also referred to as active layer) in a chip is mounted on the mounting surface in a direction in which the light-emitting layer gets closer to the mounting surface (heat sink) in the up-and-down direction.

According to the semiconductor laser device of this embodiment, heat generated by the light-emitting layer of the laser diode in operation is transferred to the submount at a short distance from the light-emitting layer, and radiated. Therefore, the heat release characteristic of the semiconductor laser device is more improved.

Furthermore, the junction-down arrangement is particularly effective when the laser diode is a one-body chip including a plurality of light-emitting points, and when at least one electrode layer of the chip is divided in correspondence to the respective light-emitting points. In this case, during operation, heat generated by the light-emitting points (the light-emitting layer including the light emitting points) is transferred to the submount at a short distance, and radiated. Thus, the heat release characteristic of the laser diode is more improved.

The present invention provides a semiconductor laser device comprising:

a first submount composed of a predetermined material and placed on a front portion of an upper surface of a mounting surface;

a laser diode placed on the first submount;

a second submount composed of a predetermined material and placed on a portion of the mounting surface backward from the first submount; and a monitoring photodiode composed of a crystalline film stacked on an upper surface of the second submount.

In the semiconductor laser device of the invention, by adopting SiC, AlN and the like having a larger thermal conductivity than Si, the effect that the heat release characteristic is more improved compared with the conventional embodiment shown in FIG. 6A, FIG. 6B is obtained.

In one embodiment of the present invention, a light-receiving surface of the monitoring photodiode has a height less than a height of a light-emitting point of the laser diode with reference to the mounting surface.

According to the semiconductor laser device of this embodiment, the backward emitted light of the laser diode is sufficiently incident on the light-receiving surface of the monitoring photodiode. Accordingly, stable monitoring signals are obtained.

The present invention provides a semiconductor laser device comprising:

a submount placed on a mounting surface;

a monitoring photodiode embedded in the submount such that a light-receiving surface of the monitoring photodiode is exposed on a side of the submount opposite to another side of the submount facing the mounting surface;

a laser diode disposed on the submount so that a laser light-emitting rear end surface of the laser diode is positioned on the side of the monitoring photodiode;

a relay electrode disposed on a portion of the submount located on an opposite side to the laser diode in relation to the monitoring photodiode; and a metal wire connecting an electrode of the laser diode to the relay electrode, the metal wire being positioned above the light-receiving surface of the monitoring photodiode, and part of the metal wire being substantially parallel to an optical axis of laser light emitted from the laser light-emitting rear end surface of the laser diode.

According to the present invention, the metal wire has a portion substantially parallel to the optical axis, and therefore the laser light emitted from the laser light-emitting rear end surface can effectively be reflected to the light-receiving surface of the laser diode. Thus, the light amount detected by the monitoring photodiode can be increased.

In one embodiment of the present invention, a junction of at least one of metal wires and the relay electrode connected thereto has a spherical shape.

According to the semiconductor of the above embodiment, since the junction has a spherical shape, part of light emitted from the light-emitting rear end surface of the laser diode, passing above the monitoring photodiode and reaching the spherical junction can be made incident on the light-receiving surface. Therefore, the light amount detected by the monitoring photodiode can be increased.

In one embodiment of the present invention, the metal wire intersects with the optical axis of laser light and is disposed in a plane substantially perpendicular to a surface of the submount.

According to the above embodiment, the metal wire reflects the light emitted from the light-emitting rear end surface of the laser diode, so that the amount of light emitted from the light-emitting rear end surface and made incident on the light-receiving surface can further be increased.

The present invention provides a semiconductor laser device comprising:

a submount placed on a mounting surface;

a monitoring photodiode embedded in the submount such that a light-receiving surface of the monitoring photodiode is exposed on a side of the submount opposite to another side of the submount facing the mounting surface;

a relay electrode disposed on a portion of the submount in which portion the monitoring photodiode is not disposed;

a plurality of laser diodes disposed on a portion the submount located on an opposite side to the relay electrode in relation to the monitoring photodiode so that laser light-emitting rear end surfaces are positioned on the side of the monitoring photodiode; and a plurality of metal wires connecting respective electrodes of the plurality of laser diodes to the relay electrode, wherein all of optical axes of laser lights emitted from the respective laser light-emitting rear end surfaces of the laser diodes are present in the same plane substantially parallel to a surface of the submount, and these optical axes are parallel to one another in the same plane; and each of the plurality of metal wires intersects with an optical axis of laser light emitted from each laser diode connected to each of the metal wires, and part of each of the metal wires is disposed in a plane substantially perpendicular to the surface of the submount.

According to the present invention, in a semiconductor laser device having a plurality of laser diodes that are not vertically stacked such as a hybrid two-wavelength laser and a monolithic two-wavelength laser, the amount of light emitted from the light-emitting rear end surface of each laser diode and incident on the monitoring photodiode can be increased. Therefore, the control of emitted light amount of the laser diode can accurately be performed.

The present invention also provides a semiconductor laser device comprising:

a submount placed on a mounting surface;

a monitoring photodiode embedded in the submount such that a light-receiving surface of the monitoring photodiode is exposed on a side of the submount opposite to another side of the submount facing the mounting surface;

a relay electrode disposed on a portion of the submount in which portion the monitoring photodiode is not disposed;

a plurality of laser diodes disposed on a portion of the submount located on an opposite side to the relay electrode in relation to the monitoring photodiode so that laser light-emitting rear end surfaces of the laser diodes are positioned on the side of the monitoring photodiode; and a plurality of metal wires connecting respective electrodes of the plurality of laser diodes to the relay electrode, wherein at least one of the plurality of metal wires intersects with an optical axis of laser light emitted from any one of the plurality of laser diodes and is disposed in a plane substantially perpendicular to a surface of the submount.

According to the present invention, in a semiconductor laser device in which laser diodes, such as a three-wavelength laser, for example, are vertically disposed, the amount of light emitted from the light-emitting rear end surface of at least one laser diode, and incident on the monitoring photodiode can be increased. Therefore, the control of emitted light from the at least one laser diode can accurately be performed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A, 2B and 2C are views showing modification of the semiconductor laser device;

FIGS. 3A and 3B are views showing the construction of a semiconductor laser device according to another embodiment of the present invention;

DETAILED DESCRIPTION OF THE PREF\ERRED EMBODIMENTS

A semiconductor laser device of the invention will hereinafter be described in detail by the following embodiments illustrated.

Figure 1A:
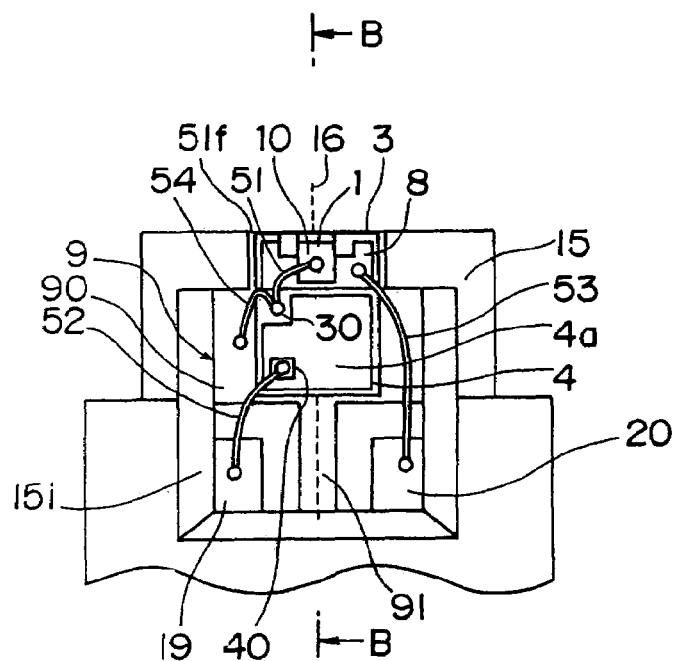
FIGS. 1A, 1B and 1C are views showing the construction of a semiconductor laser device according to one embodiment of the present invention.
Figure 1B:
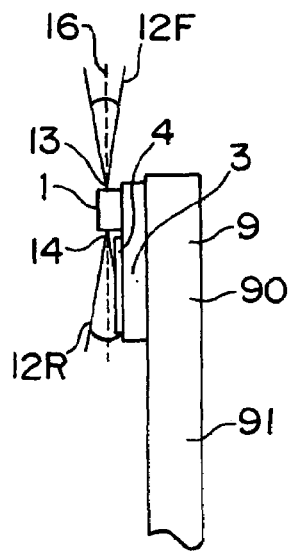
Figure 1C:
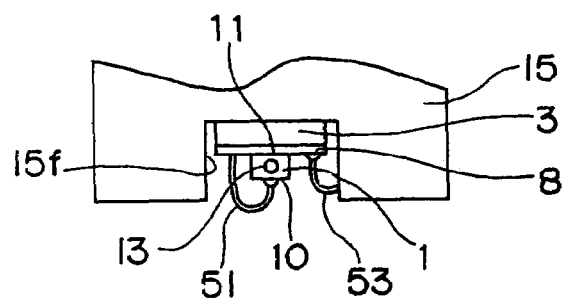

FIGS. 1A, 1B and 1C show the construction of a semiconductor laser device mounted in a package including a lead frame. The semiconductor laser device is of a type in which one-chip laser diode emits laser light having one wavelength. FIG. 1A is a view of a laser diode 1 mounted on an island 90 of a lead frame 9 seen from a direction perpendicular to an island surface (mounting surface) thereof. FIG. 1B is a schematic cross-sectional view taken along line B—B of FIG. 1A. FIG. 1C is a front view of the laser diode 1.

Hereinafter, the directions are determined based on a light-emitting direction 16 of the laser diode 1. That is, the direction in which laser light is emitted from the laser diode 1 toward an object is defined as "forward" (the upward direction in FIGS. 1A and 1B), wherein the laser light irradiates the object such as an optical disc (not shown) to be recorded and reproduced). The direction opposite to the "forward" direction is defined as a "backward" (the downward direction in FIGS. 1A and 1B). The leftward and rightward directions in FIG. 1A are defined as "left and right" respectively. The left direction in FIG. 1B is defined as "upward." In this direction, the height from the island surface (mounting surface) is determined.

As shown in FIG. 1A, the package of this semiconductor laser device includes the lead frame 9 composed of a metal material and a resin portion 15 surrounding the lead frame 9. As is seen from FIG. 1C, the resin portion 15 is provided with an open-front-and-top concave portion 15$f$, and also provided with an open-top opening 15$i$ connecting with the rear of the concave portion 15$f$ as is seen from FIG. 1A.

The lead frame 9 includes the island 90 laid across the concave portion 15$f$ and the opening 15$i$, a support bar electrode 91 connecting with the center of the rear of the island 90 and extending backward, and lead electrodes 19, 20 disposed on both sides of the support bar electrode 91 spaced from them. The lead electrodes 19, 20 each substantially have the same height as the island 90. These support bar electrode 91 and lead electrodes 19, 20 extend backward, penetrate the resin portion 15 and protrude outside the package as three lead pins, although not shown.

A rectangular parallelepiped one-body submount 3 composed of SiC (silicon carbide having a thermal conductivity of 270 W/m·K) is placed on the island 90 of the lead frame 9. SiC forming this submount 3 is characterized in that it is an insulator having a larger thermal conductivity than Si. As a material of the submount 3, AlN (aluminum nitride having a thermal conductivity of 60–260 W/m·K) may also be used in place of sic.

The front portion of an upper surface of the submount 3 is provided with a laser diode mounting electrode 8, which substantially has the same dimension in the front-rear direction as the laser diode 1. The left-right dimension of the electrode 8 is set a little larger than that of the laser diode 1 so that wiring is performed. Such an electrode 8 is easily formed by depositing a metal layer on the upper surface of the submount 3 prior to an assembly process and patterning the metal layer.

The front-rear dimension of the laser diode 1 corresponds to a dimension of the laser diode in a laser light-emitting direction, namely substantially corresponds to a resonator length.

The laser diode 1 is placed on the laser diode mounting electrode 8 located at the front of the submount 3. Specifically, a lower electrode (not shown) of the laser diode 1 is connected to the laser diode mounting electrode 8 through a brazing material.

A monitoring photodiode 4 composed of a crystalline silicon film is stacked on a region of the upper surface of the submount 3, which region is located backward from the laser diode 1.

As described above, the "crystalline silicon film" means a film composed of silicon having a certain type of crystallinity such as continuous grain silicon (referred to as CGS or CG silicon) described in JP-7-161634A and a polysilicon. JP-7-161634A discloses a technique of forming continuous grain silicon on an insulating substrate.

Before an assembly process, a crystalline silicon film constructing the monitoring photodiode 4 is previously deposited on a surface of the submount 3 in a wafer process and patterned into a substantial rectangular parallelepiped shape in order to obtain stable and accurate monitoring signals. A light-receiving surface 4a composed of a PN junction is formed by introducing impurities into the crystalline silicon film. One electrode 40 of the photodiode is provided on the light-receiving surface 4a. The pattern of the crystalline silicon film is of a generally parallelepiped shape. In this example, however, a corner portion thereof is eliminated on the side closer to the laser diode mounting electrode 8. The other electrode 30 of the photodiode 4 serving as a relay electrode is provided on a portion of the surface (upper surface) of the submount 3 corresponding to the above-stated corner portion.

In assembling this semiconductor laser device, the submount 3 is placed on the island 90 of the lead frame 9, the submount 3 being in advance formed with the monitoring photodiode 4 and the laser diode mounting electrode 8. Subsequently, the laser diode 1 is placed on the laser diode mounting electrode 8 via brazing material. After that, wire bonding is performed such that the one electrode 40 of the monitoring photodiode 4 is connected to the lead electrode 19 via a metal wire 52, and that the laser diode mounting electrode 8 is connected to the lead electrode 20 via a metal wire 53. At the same time, an upper electrode (electrode on the upper side after mounting) of the laser diode 1 is connected to the other electrode 30 of the monitoring photodiode 4 via a metal wire 51, and the electrode 30 is connected to the island 90 via a metal wire 54.

Figure 7A:
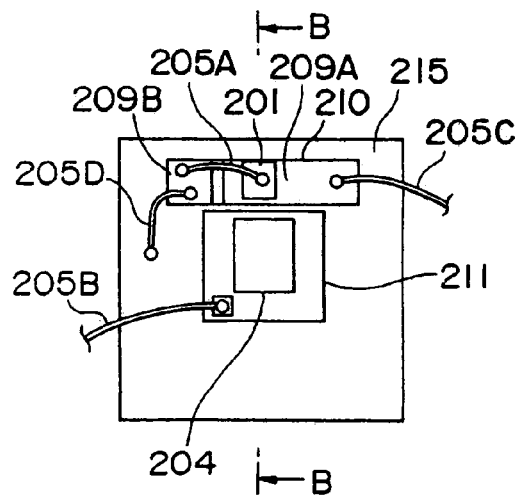
FIGS. 7A and 7B are views showing the construction of another conventional semiconductor laser device.
Figure 7B:
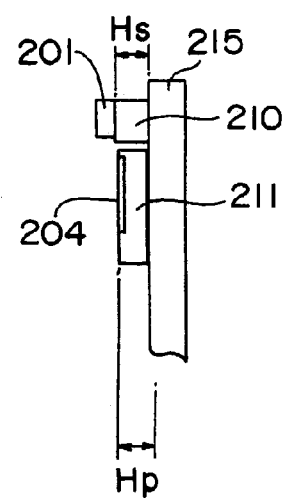

According to this assembly process, manufacture of the semiconductor laser becomes easier than that of the conventional semiconductor shown in FIG. 7 because it is not necessary to align the submount 3 with the monitoring photodiode 4 in order to stabilize monitoring signals. Moreover, the upper electrode of the laser diode 1 is connected to the island 90 via the metal wires 51, 54 through the relay electrode 30. Therefore, a height difference between a first bonding position and a second bonding position of the respective metal wires is reduced, compared with the case where it is directly connected. Thus, wire bonding becomes easy, and manufacture becomes easier.

In this semiconductor laser device, the submount 3 is a one-body component and thus the number of components is reduced compared with the conventional embodiment shown in FIG. 7, which results in a cost reduction.

In operation, the laser diode 1 is electrically energized from the outside by using the lead electrode 20 and the support bar electrode 91. Monitoring signals outputted by the monitoring photodiode 4 are taken out by the lead electrode 19 and the support bar electrode 91. Since the material of the submount 3 is an insulator (SiC in this embodiment), favorable electrical isolation is achieved between the laser diode 1 and the monitoring photodiode 4.

In this semiconductor laser device, laser light 12F emitted forward from a light emitting point 13 on a front end surface of the laser diode 1 (referred to as "forward emitted light") is applied to an object (e.g., an optical disc to be recorded/reproduced). On the other hand, laser light 12R emitted backward from a light emitting point 14 on a rear end surface of the laser diode 1 (referred to as "backward emitted light") is applied to the monitoring photodiode 4. The light received by the monitoring photodiode 4 is photoelectrically converted to a monitoring signal, which is used for controlling an output of the laser diode 1 by an unshown control circuit.

Here, the laser diode mounting electrode 8 has almost the same dimension in the front-rear direction as the laser diode 1. Thus the forward emitted light 12F and backward emitted light 12R of the laser diode 1 are emitted without being interrupted by the laser diode mounting electrode 8. Therefore, the backward emitted light 12R becomes a stable monitoring signal because of the monitoring photodiode 4, and the forward emitted light 12F is stably applied to the object. Moreover, as seen from FIG. 1B, the light-receiving surface 4a of the monitoring photodiode 4 has height less than that of the light emitting point 14 of the laser diode 1. Therefore the backward emitted light 12R of the laser diode 1 is sufficiently incident on the light-receiving surface 4a of the monitoring photodiode 4. Accordingly, more stable monitoring signals are obtained.

In the semiconductor laser device, the monitoring photodiode 4 is composed of crystalline silicon and thus the dark current of the monitoring photodiode 4 can be suppressed compared with the one composed of amorphous silicon.

Figure 6A:
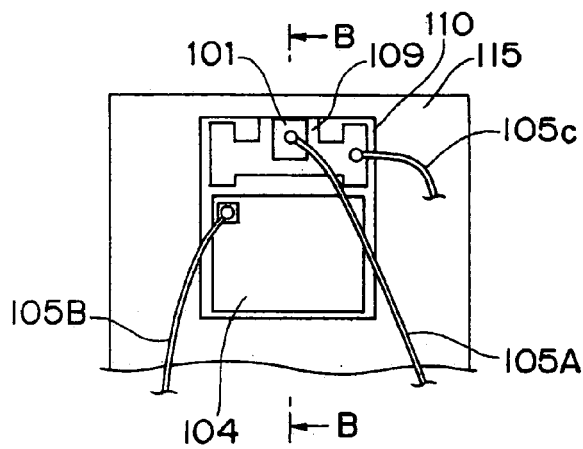
FIGS. 6A and 6B are views showing the construction of a conventional semiconductor laser device.
Figure 6B:
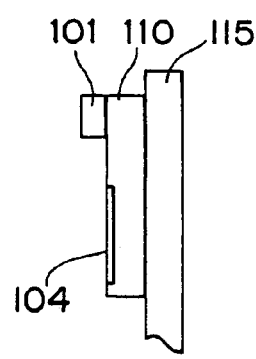

In the semiconductor laser device, heat generated by the laser diode 1 during operation is released to the lead frame 9 through the submount 3. In this embodiment, the material of the submount 3 is composed of SiC having a larger thermal conductivity than Si which is used in the prior art shown in FIGS. 6A and 6B. Therefore, the heat release characteristic (performance of releasing heat generated by the laser diode 1 in operation) is improved, and consequently, reliability of products is improved.

The above-stated improvement in the heat release characteristic makes it possible to mount a laser diode having a large heat value even if a resin package, a resin lead frame package or the like is used which is inferior to a metal package in the heat releasing characteristic. Further, as described below, it becomes possible to mount various combinations of laser diodes, so that a product that matches the user's need can easily be fabricated.

FIGS. 2A, 2B and 2C show a semiconductor laser device as a modification of the above-stated one. This semiconductor laser device is of a type in which one-chip laser diode emits laser light having one wavelength as in the case of the semiconductor laser device of FIGS. 1A, 1B and 1C. FIG.

2A is a view of a laser diode 1 mounted on an island 90 of a lead frame 9, seen from a direction perpendicular to an island surface (mounting surface) of the semiconductor laser device. FIG. 2B schematically shows a cross section taken along line B—B of FIG. 2A. The same components as those of FIGS. 1A, 1B and 1C are designated by the same numerals (this is also applied to the other drawings).

In this example, in place of the electrode 30 of the photodiode 4 in FIG. 1, an electrode 31 of the photodiode 4, which serves as a relay electrode, is provided at the center of the rear of the submount 3 different from mounted position of the electrode 30. A metal wire 51 is disposed in the front-rear direction along an optical axis 16 of the laser diode 1 and connects the electrode 31 of the monitoring photodiode 4 with the upper electrode of the laser diode 1. Further, a metal wire 54 connects the electrode 31 to the support bar electrode 91.

In operation, the laser diode 1 is electrically energized from the outside of the package by using the lead electrode 20 and the support bar electrode 91 in the same manner as the semiconductor laser device of FIGS. 1A, 1B and 1C. Monitoring signals are outputted by the monitoring photodiode 4 and taken out by the lead electrode 19 and the support bar electrode 91.

In this case, a portion of the backward emitted light 12R of the laser diode 1 is not directly incident on the light-receiving surface of the monitoring photodiode 4 as shown in FIG. 2C. This portion of the backward emitted light 12R is reflected by a portion of the metal wire 54 in proximity of the relay electrode 31, specifically, by a surface of a ball 54*a* formed at an edge portion of the wire 54 and a surface of a curved portion of the wire 54, and incident on the light-receiving surface 4*a* of the monitoring photodiode 4 as reflected light 12R'. Therefore, the amount of incident light increases to obtain more stable monitoring signals.

FIGS. 3A 3B and 3C show a construction of a semiconductor laser device of a type in which one-chip laser diode emits laser light having two wavelengths.

FIG. 3A is a front view of a submount 3 and a laser diode 2 thereon which construct the semiconductor laser device. FIG. 3B is a view of the laser diode 2 mounted on an island 90 of a lead frame 9, seen from a direction perpendicular to a surface of the island (mounting surface).

As shown in FIG. 3A, the laser diode 2 constructing the semiconductor laser device is a one-body chip having two left and right light emitting points 13-1, 13-2 on its front end surface. Light-emitting points 14-1, 14-2 are provided on its rear surface in correspondence to those light-emitting points. A one-body upper electrode 10 of the laser diode 2 is continuous in a layer direction. On the other hand, a lower electrode is divided into left portion 11-1 and right portion 11-2 by a groove 6 extending in the front-rear direction. Because of the groove 6, the two left and right portions 11-1, 11-2 are not short-circuited. A laser diode mounting electrode on the submount 3 is also divided into two portions 8-1, 8-2 in correspondence to the lower electrodes 11-1, 11-2. The lower electrodes 11-1, 11-2 are connected to the laser diode mounting electrodes 8-1, 8-2, respectively, by a brazing material.

As shown in FIG. 3B, a lead frame 9A includes an island 90, a support bar electrode 91 connected with the rear of the island 90 and extending backward, and a lead electrode 19 disposed apart from the island 90 and the lead electrode 19 and in parallel with the support bar electrode 91. The lead frame 9A also includes lead electrodes 20-1, 20-2 disposed on both sides of the island 90. The lead electrodes 19, 20-1 and 20-2 have substantially the same height as the island 90.

Although not shown, these support bar electrode 91 and lead electrodes 19, 20-1 and 20-2 extend backward, penetrate the resin portion 15 and protrude outside the package as four lead pins.

In a wire bonding process, one electrode 40 of the monitoring photodiode 4 is connected to the lead electrode 19 via a metal wire 52, while the laser diode mounting electrodes 8-1, 8-2 are connected to the lead electrodes 20-1, 20-2 via metal wires 53-1, 53-2, respectively. Further, the upper electrode 10 of the laser diode 2 (see FIG. 3A) is connected to the other electrode 30 of the monitoring photodiode 4 via a metal wire 51, and the electrode 30 is connected to the island 90 via a metal wire 54.

In operation, a half portion 2-1 of the laser diode 2 is electrically energized from the outside of the package by using the lead electrode 20-1 and the support bar electrode 91, while the remaining half portion 2-2 of the laser diode 2 is electrically energized by using the lead electrode 20-2 and the support bar electrode 91. Thereby, the left and right portions 2-1, 2-2 of the laser diode are electrically connected for operation, independently of each other. Monitoring signals outputted by the monitoring photodiode 4 are taken out by the lead electrode 19 and the support bar electrode 91.

In this embodiment, the laser diode 2 is mounted on the laser diode mounting electrodes 8-1, 8-2 in such a manner as "junction down." That is, the laser diode 2 is mounted on the submount 3 in such a manner as the distance from a light emitting layer including the respective light emitting points gets closer to the submount 3 in the up-and-down direction. In this arrangement, heat generated by each of the light emitting points is transferred to the submount 3 at a short distance, and released. This improves the heat release characteristic.

Figure 4B:
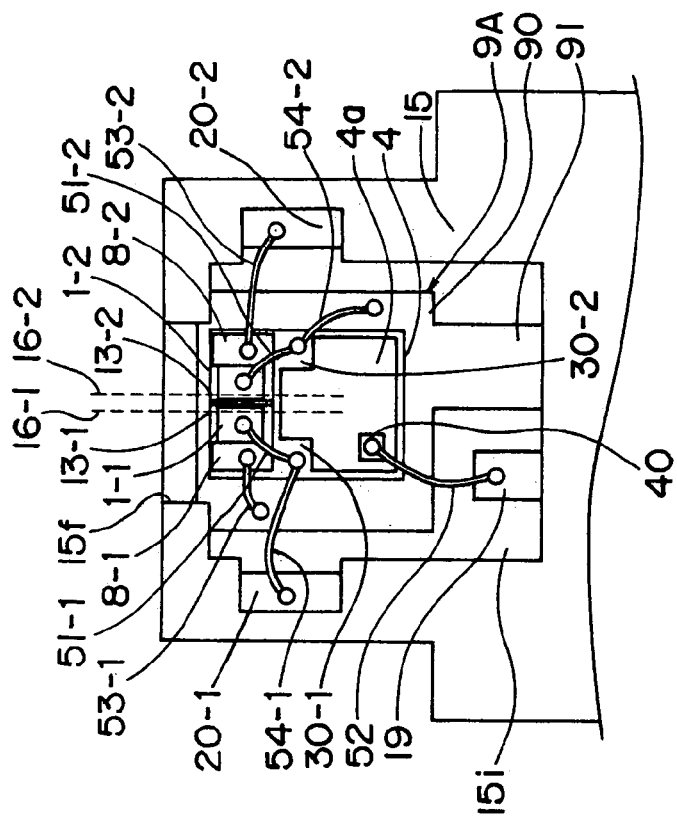
FIGS. 4A and 4B are views showing the construction of a semiconductor laser device according to still another embodiment of the present invention.
Figure 4A:
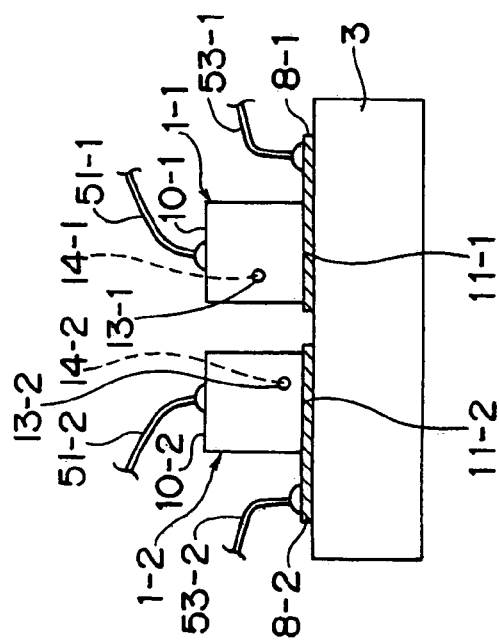

FIGS. 4A and 4B show another construction of a semiconductor laser device of a type in which a two-chip laser diode emits laser light having two wavelengths.

As shown in FIG. 4A, the semiconductor laser includes two chips of independent laser diodes 1-1, 1-2. The laser diode 1-1 is a one-body chip having light emitting points 13-1, 14-1 at its front and rear end surfaces respectively. The laser diode 1-2 is a one-body chip having light emitting points 13-2, 14-2 on its front and rear end surfaces respectively. A laser diode mounting electrode on the submount 3 is divided into two portions 8-1, 8-2 in the same manner as the semiconductor laser device of FIG. 3.

As shown in FIG. 4B, a lead frame 9A is the same one as shown in FIG. 3B. Two electrodes 30-1 and 30-2 serving as relay electrodes are provided on the submount 3 in proximity of the laser diode mounting electrodes 8-1, 8-2.

In a wire bonding process, one electrode 40 of the monitoring photodiode 4 is connected to the lead electrode 19 via a metal wire 52, the laser diode mounting electrode 8-1 is connected to the island 90 via a metal wire 53-1, and the laser diode mounting electrode 8-2 is connected to a lead electrode 20-2 via a metal wire 53-2. Further, upper electrodes 10-1, 10-2 of the laser diodes 1-1, 1-2 (see FIG. 4A) are connected to other electrodes 30-1, 30-2 of the monitoring photodiode 4 via metal wires 51-1, 52-2, respectively. The electrode 30-1 is connected to a lead electrode 20-1 via a metal wire 54-1, while the electrode 30-2 is connected to the island 90 via a metal wire 54-2.

In operation, the laser diode 1-1 is electrically energized from the outside of the package by using the lead electrode 20-1 and the support bar electrode 91, while the laser diode 1-2 is electrically energized by using the lead electrode 20-2 and the support bar electrode 91. Thereby, the laser diodes 1-1, 1-2 are electrically connected independently of each other to operate. Monitoring signals outputted by the monitoring photodiode 4 are taken out by the lead electrode 19 and the support bar electrode 91.

Figure 5B:
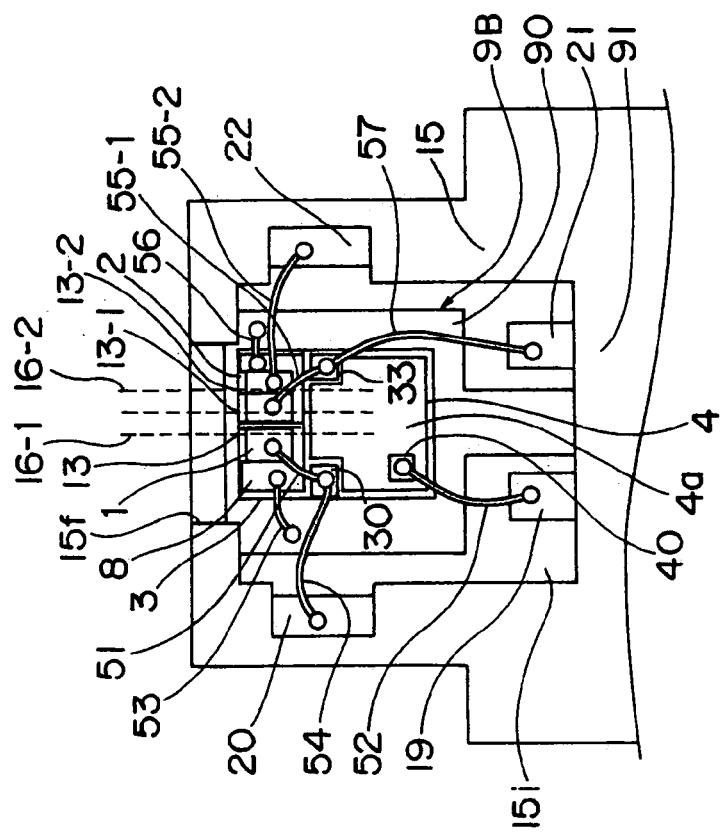
FIGS. 5A and 5B are views showing the construction of a semiconductor laser device according to yet another embodiment of the present invention.
Figure 5A:
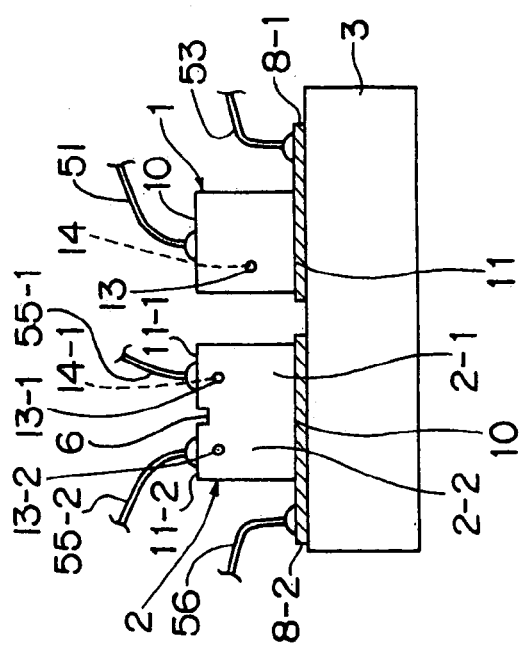

FIGS. 5A and 5B show the construction of a semiconductor laser device of a type in which a two-chip laser diode emits laser light having three wavelengths.

As shown in FIG. 5A, the semiconductor laser device includes two chips of independent laser diodes 1, 2. A laser diode 1 is the same one as shown in FIG. 1. As for the laser diode 2, the chip itself is the same one as shown in FIG. 1, but it is mounted upside down. A laser diode mounting electrode is divided into two portions 8-1, 8-2 in correspondence to the respective laser diodes 1, 2.

As shown in FIG. 5B, a lead frame 9B includes an island 90, a support bar electrode 91 connecting with the center of the rear of the island 90 and extending backward, lead electrodes 19, 21 disposed on both sides of the support bar electrode 91 spaced from them and lead electrodes 20, 22 disposed on both sides of the island 90. The lead electrodes 19, 20, 21 and 22 have substantially the same height as the island 90. Although not shown, these support bar electrode 91, lead electrodes 19, 20, 21 and 22 extend backward, penetrate the resin portion 15 and protrude outside the package as five lead pins. Two electrodes 30 and 33 of a monitoring photodiode 4 serving as relay electrodes are provided on a submount 3 in proximity of the laser diode mounting electrodes 8-1, 8-2.

In a wire bonding process, one electrode 40 of the monitoring photodiode 4 is connected to the lead electrode 19 via a metal wire 52, the laser diode mounting electrodes 8-1, 8-2 are connected to the island 90 via metal wires 53, 56 respectively. An upper electrode 11-2 of the laser diode 2 (see FIG. 5A) is connected to the lead electrode 22 via a metal wire 55-2. Further, an upper electrode 10 of the laser diode 1 is connected to one of another electrode 30 of the monitoring photodiode 4 via a metal wire 51, and an upper electrode 11-1 of the laser diode 2 is connected to another electrode 33 via a metal wire 55-1. These electrodes 30, 33 are connected to the lead electrodes 20, 21 via metal wires 54, 57, respectively.

In operation, the laser diode 1 is electrically energized from the outside of the package by using the lead electrode 20 and the support bar electrode 91, a half 2-1 of the laser diode 2 is electrically energized by using the lead electrode 21 and the support bar electrode 91, and the remaining half 2-2 of the laser diode 2 is electrically energized by using the lead electrode 22 and the support bar electrode 91. Thereby, the laser diodes 1 and the respective portions 2-1, 2-2 of the laser diode 2 are electrically connected independently of one another to operate. Monitoring signals outputted by the monitoring photodiode 4 are taken out by the lead electrode 19 and the lead electrode 20 or 21.

In this manner, the heat release characteristic is improved according to this invention. Therefore, various combinations of laser diodes can be mounted even if the lead frame is used for the package. Thus, it is possible to easily make a combination of laser diodes having different wavelengths and different outputs, such as a combination of a two-wavelength laser (DVD (low output)+CD (high output)) and a one-wavelength laser (blue laser). Specifically, it becomes possible to make various combinations such as DVD-R and blue laser, CD-R and blue laser. That is, it is possible to make a product that meets the user's need by changing the laser diodes on the submount without requiring complicated changes during the manufacturing process. As a result, the development period can be reduced.

In this embodiment, the lead frame is used for the package. However, other package materials such as stems may also be used.

Furthermore, the one-body submount 3 is used in this embodiment, but it is not limited thereto. In another aspect of the embodiment, the submount may be divided into a front and rear portions, i.e., a first submount on which the laser diode is mounted and a second submount on which the monitoring photodiode is stacked. In this case, SiC, AlN or the like is also adopted as a material of the first submount which has a larger thermal conductivity than Si. There is achieved the effect that the heat release characteristic is improved compared with the conventional embodiment shown in FIG. 6. In this case, it is also preferable that the height of the light-receiving surface of the monitoring photodiode is appropriately set to less than the height(s) of the light emitting point(s) of the laser diode.

Figure 8A:
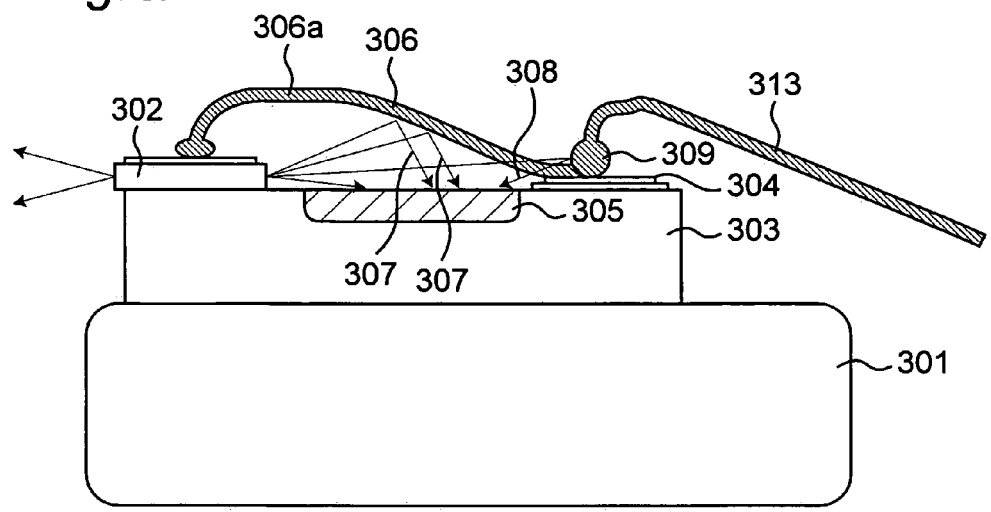
FIGS. 8A and 8B are views showing the construction a semiconductor laser device according to a different embodiment of the present invention.
Figure 8B:
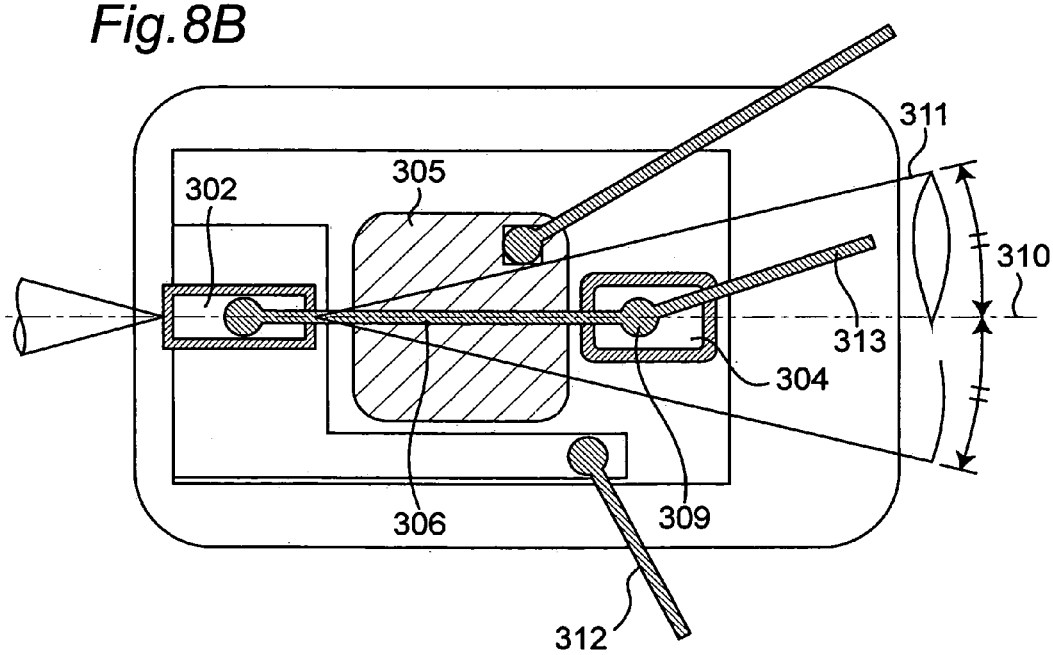

FIGS. 8A and 8B are views showing a construction of a semiconductor laser device according to a different embodiment of the present invention. In more detail, FIGS. 8A and 8B are a side view and a top plan view of the semiconductor laser device, respectively.

This semiconductor laser device includes a heat sink 301, a submount 303, a monitoring photodiode 305, a laser diode 302, a relay electrode 304 and an Au wire 306 as a metal wire.

The submount 303 is connected on the heat sink 301. The monitoring photodiode 305 is embedded in the substantially central surface of the submount 303 opposite to the side of the heat sink such that a light-receiving surface of the monitoring photodiode 305 is exposed. As shown in FIG. 8B, the light-receiving surface of the monitoring photodiode 305 substantially has the shape of square.

The laser diode 302 is disposed along one side of the substantially square light-receiving surface of the monitoring photodiode 305 such that a light-emitting rear end surface of the laser diode 302 is adjacent to the one side of the light-receiving surface. The relay electrode 304 is located adjacently to the other side of the monitoring photodiode 305 opposite to the one side thereof. There are substantially aligned the laser diode 302, the monitoring photodiode 305 and the relay electrode 304.

The Au wire 306 connects an electrode of the laser diode 302 with the relay electrode 304. A junction of the Au wire 306 and the relay electrode 304 has a gently reduced shape in thickness. The junction having the gently reduced shape is connected to one end portion of another Au wire 313. A junction of the Au wire 313 and the relay electrode 304 has a spherical shape.

The Au wire 306 has a portion 306a roughly parallel to an optical axis 310 of laser light emitted from the laser light-emitting rear end surface of the laser diode 302. A part of this portion 306a is positioned above the light-receiving surface of the monitoring photodiode 305.

The Au wire 306 is disposed in a plane substantially perpendicular to the surface of the submount 303 such that the Au wire 306 intersects with the optical axis 310 of laser light, as shown in FIG. 8B.

In FIGS. 8A and 8B, reference numeral 311 denotes expanded laser light emitted from the light-emitting rear end surface of the laser diode 302. Reference numeral 312 denotes wiring extended from an electrode on the side of the submount 303 of the laser diode 302.

According to the embodiment, since the Au wire 306 has the portion 306a substantially parallel to the optical axis 310, a part 307 of laser light emitted from the laser light-emitting rear end surface is effectively reflected to the light-receiving surface of the monitoring photodiode 305 by the Au wire 306. Therefore, the light amount detected by the monitoring photodiode is increased.

According to the embodiment, the junction 309 of the Au wire 313 and the relay electrode 304 has a spherical form. Therefore, a part 308 of laser light can be made incident on the light-receiving surface of the monitoring photodiode 305, wherein the laser light is emitted from the laser light-emitting rear end surface of the laser diode 302, passes above the monitoring photodiode 305 and reaches the spherical junction 309. Thus, the light amount detected by the monitoring photodiode 305 can be increased.

According to the embodiment, the Au wire 306 intersects with the optical axis 310 of laser light emitted from the laser light-emitting rear end surface and is also disposed in a plane substantially perpendicular to the surface of the submount 303. Therefore, the light amount emitted from the laser light-emitting rear end surface and reflected to the light-receiving surface of the monitoring photodiode 305 by the Au wire 306 can further be increased.

In the above embodiment, the junction 309 of the Au wire 313 and the relay electrode 304 has a spherical shape. Alternatively, a junction of the metal wire with its one end portion connected to the laser diode and the relay electrode may have a spherical shape. With this arrangement, the light amount detected by the light-receiving surface of the monitoring photodiode can be increased in the same manner as the above embodiment.

Figure 9A:
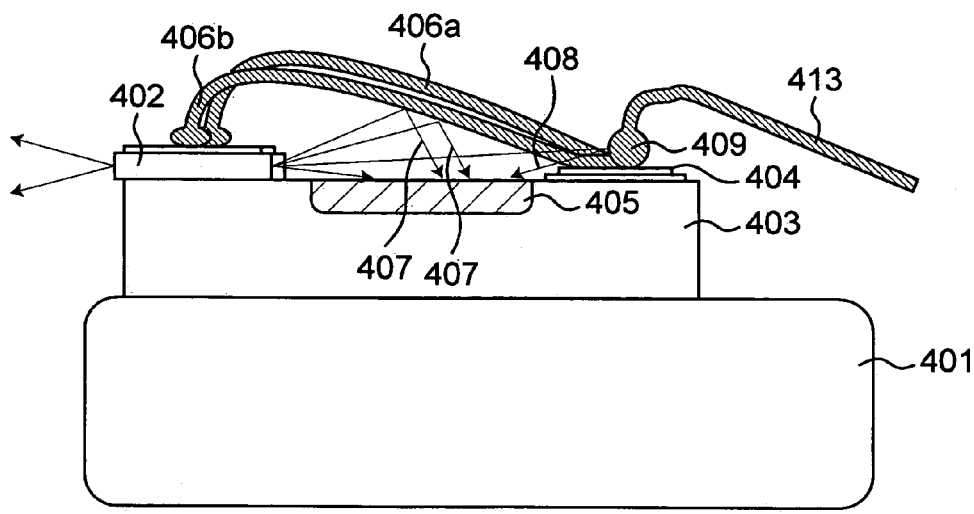
FIGS. 9A and 9B are views showing the construction a semiconductor laser device according to another different embodiment of the present invention.
Figure 9B:
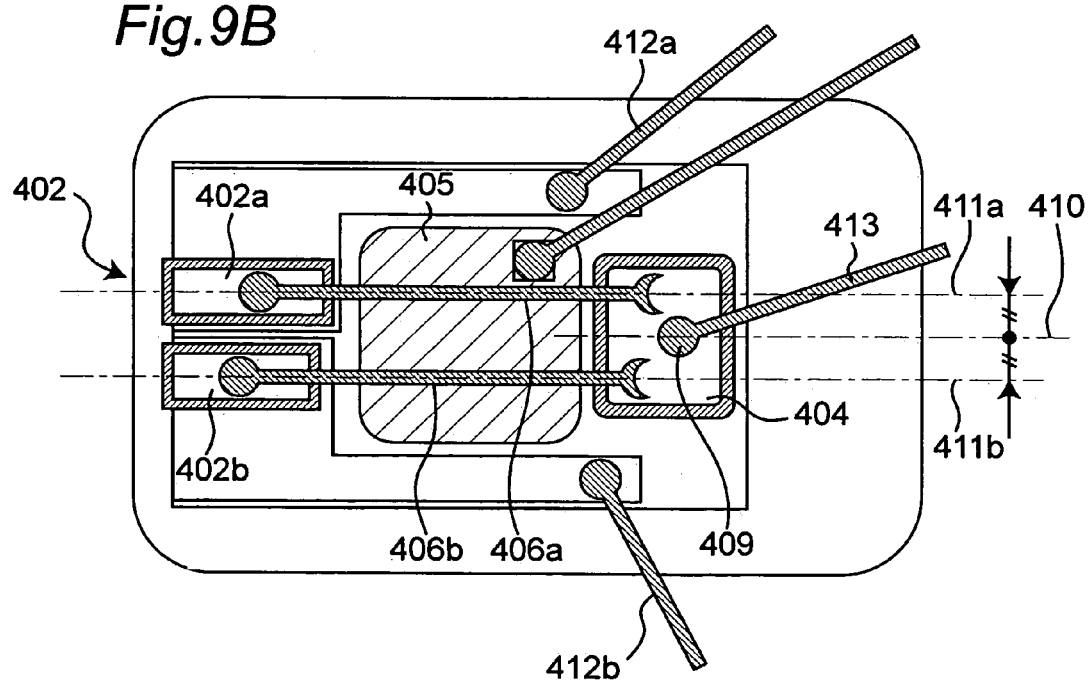

FIGS. 9A and 9B are views showing the construction of a semiconductor laser device according to another embodiment. In more detail, FIG. 9A is a side view of the semiconductor laser device, and FIG. 9B is a top plan view of the semiconductor laser device.

This semiconductor laser device includes a heat sink 401, a submount 403, a monitoring photodiode 405, a laser diode chip 402, a relay electrode 404 and Au wires 406a, 406b as an example of a metal wire.

The submount 403 is connected onto the heat sink 401. The monitoring photodiode 405 is of a type coping with two wavelengths of a red laser and an infrared laser. The monitoring photodiode 405 is embedded in the substantial center of a surface of the submount 403 opposite to the side of the heat sink such that a light-receiving surface is exposed. As shown in FIG. 9B, the light-receiving surface of the monitoring photodiode 405 has a substantially square shape.

The laser diode chip 402 includes a red laser diode 402a and an infrared laser diode 402b. As shown in FIG. 9B, the red laser diode 402a and the infrared laser diode 402b are each disposed adjacent to one side of the square light-receiving surface of the monitoring photodiode 405 in the state where their respective light-emitting rear end surfaces are directed toward the one side.

In more detail, the red laser diode 402a and the infrared laser diode 402b are disposed on the submount so that an optical axis 411a of laser light emitted from a laser light-emitting rear end surface of the red diode 402a and an optical axis 411b of laser light emitted from a laser light-emitting rear end surface of the infrared diode 402b are present in a plane substantially parallel to the surface of the submount 403 and that these optical axes are parallel to each other in the same plane.

The relay electrode 404 is disposed adjacent to the other side of the monitoring photodiode 405 opposite to the one side thereof on the side of laser diode chip. The laser diode chip 402, the monitoring photodiode 405 and the relay electrode 404 are substantially aligned.

The Au wire 406a connects an electrode of the red laser diode 402a of the submount 403 and the relay electrode 404. The Au wire 406a intersects with the optical axis 411a of laser light emitted from the light-emitting rear end surface of the red laser diode 402a and is disposed in a plane substantially perpendicular to the surface of the submount 403.

The Au wire 406b connects an electrode of the infrared laser diode 402b of the submount 403 and the relay electrode 404. The Au wire 406b intersects with the optical axis 411b of laser light emitted from the light-emitting rear end surface of the infrared laser diode 402b and is disposed in a plane substantially perpendicular to the surface of the submount 403.

As shown in FIG. 9B, a junction 409 of a metal wire 413 and the relay electrode 404 has a spherical shape where the metal wire 413 is different from the Au wires 406a, 406b, ends of which each are connected to the relay electrode 404.

In FIGS. 9A and 9B, reference numeral 410 denotes a center line between the optical axis 411a of the red laser diode 402a and the optical axis 411b of the infrared laser diode 402b. Reference numeral 407 denotes laser light that is emitted from the infrared laser diode 402b, reflected by the Au wire 406b and incident on the light-receiving surface of the monitoring photodiode 405. Reference numeral 408 denotes laser light that is emitted from the laser diode chip 402, reflected by the spherical junction 409 of the Au wire 403 and incident on the light-receiving surface of the monitoring photodiode 405.

The semiconductor laser device according to the above embodiment can increase the light amount that is emitted from the respective light-emitting rear end surfaces of the red laser diode 402a and the infrared laser diode 402b and incident on the monitoring photodiode 405. Therefore, it is possible to accurately control the emitted light amount of the red laser diode 402a and the infrared laser diode 402b.

According to the above embodiment, because the junction 409 of the Au wire 413 and the relay electrode 404 has a spherical shape, a part of laser light, which is emitted from the laser diodes 402a, 402b and reflected by the junction 409 of the Au wire 413, can be made incident on the light-receiving surface of the monitoring photodiode 405. Therefore, light intensity of the laser diodes 402a, 402b can be adjusted more accurately.

In the above embodiment, the two laser diodes 402a, 402b are disposed on the submount 403 so that the optical axes 411a, 411b of the respective laser lights emitted from the individual laser light-emitting rear end surfaces of the two laser diodes 402a, 402b are present in the same plane substantially parallel to the surface of the submount 403 and so that these optical axes are substantially parallel to each other in the same plane. In this state, each of the two respective metal wires 406a, 406b is disposed in a plane that includes the optical axis 411a, 411b of the laser diode 402a, 402b, to which each of the respective metal wires 406a, 406b is connected, and is substantially perpendicular to the surface of the submount 403. However, according to this invention, the plurality of laser diodes more than two may be disposed on the submount so that respective optical axes of laser lights emitted from respective laser light-emitting rear end surfaces of the plural except for two laser diodes are present in the same plane substantially parallel to the surface of the submount and that these optical axes are substantially parallel to one another in the same plane. In this state, each of the plural metal wires may be disposed in a plane that includes an optical axis of each laser diode, to which the metal wire is connected, and is substantially perpendicular to the surface of the submount.

In the above embodiment, the junction 409 of the Au wire 413 and the relay electrode 404 has a spherical shape, the Au wire 413 being different from the Au wires 406a, 406b whose one ends are connected to the relay electrode 404. In the case that at least one of the junctions of the metal wires, whose one ends are connected to the relay electrode, has a spherical shape, there can be increased the light amount of laser light that is incident on the light-receiving surface of the monitoring photodiode.

Figure 10A:
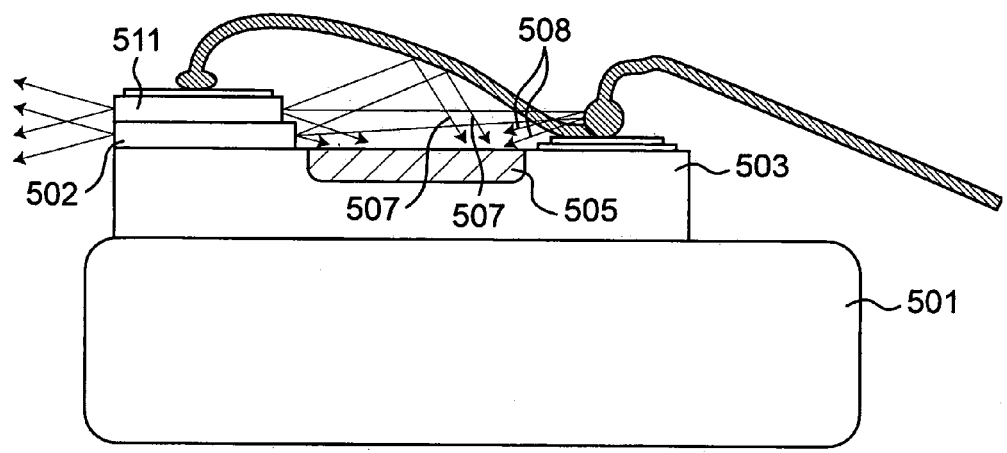
FIGS. 10A and 10B are views showing the construction a semiconductor laser device according to still another different embodiment of the present invention.
Figure 10B:
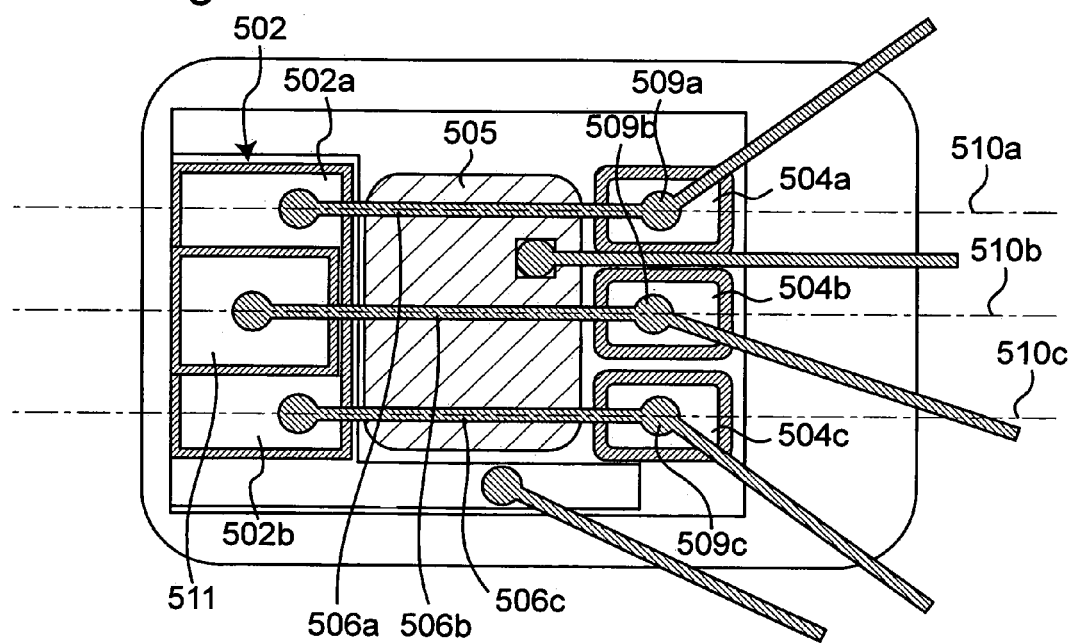

FIGS. 10A and 10B are views showing the construction of a semiconductor laser device according to another embodiment. In more detail, FIG. 10A is a side view of the semiconductor laser device, and FIG. 10B is a top plan view of the semiconductor laser device.

This semiconductor laser device includes a heat sink 501, a submount 503, a monitoring photodiode 505, a two-wavelength laser chip 502, a blue laser chip 511, relay electrodes 504a, 504b and 504c, and Au wires 506a, 506b and 506c as an example of a metal wire.

The submount 503 is connected on the heat sink 501. The monitoring photodiode 505 is of a type coping with three wavelengths of a red laser, an infrared laser and a blue laser. The monitoring photodiode 505 is disposed in a manner so as to be embedded in the substantial center of a surface of the submount 503 opposite to the side of the heat sink such that a light-receiving surface is exposed. The light-receiving surface of the monitoring photodiode 505 substantially has a rectangular shape.

The two-wavelength laser chip 502 includes a red laser diode 502a and an infrared laser diode 502b. As shown in FIG. 10B, the red laser diode 502a and the infrared laser diode 502b are each disposed adjacent to one longitudinal side of the rectangular light-receiving surface of the monitoring photodiode 505 in a state in which their respective light-emitting rear end surfaces are directed toward the one side.

The relay electrodes 504a, 504c are disposed adjacent to one side of the rectangular light-receiving surface of the monitoring photodiode 505 opposite to the longitudinal side thereof in a manner so as to face the red laser diode 502a and the infrared laser diode 502b, respectively.

The blue laser chip 511 is disposed on a surface of the two-wavelength laser chip 502, opposite to the side of the submount, adjacent to the one longitudinal side of the rectangular parallelepiped light-receiving surface of the monitoring photodiode 505 in a state in which a light-emitting rear end surface is directed toward the one longitudinal side. The relay electrode 504b is disposed adjacent to one side opposite to the one longitudinal side of the rectangular light-receiving surface of the monitoring photodiode 505 in a manner so as to face the blue laser chip 511.

The Au wire 506a connects an electrode of the red laser diode 502a opposite to the side of the submount 503 and the relay electrode 504a. The Au wire 506a intersects with an optical axis 510a of laser light emitted from the light-emitting rear end surface of the red laser diode 502a and disposed in a plane substantially perpendicular to the surface of the submount 503.

The Au wire 506c connects an electrode of the infrared laser diode 502b opposite to the side of the submount 503 and the relay electrode 504c. The Au wire 506c intersects with an optical axis 510c of laser light emitted from the light-emitting rear end surface of the infrared laser diode 502b and disposed in a plane substantially perpendicular to the surface of the submount 503.

The Au wire 506b connects an electrode of the blue laser diode 511 opposite to the side of the submount 503 and the relay electrode 504b. The Au wire 506b intersects with an optical axis 510b of laser light emitted from the light-emitting rear end surface of the blue laser diode 511 and disposed in a plane substantially perpendicular to the surface of the submount 503.

The relay electrode 504a, the monitoring photodiode 505 and the red laser diode 502a are substantially aligned. Similarly, the relay electrode 504c, the monitoring photodiode 505 and the infrared laser diode 502b are substantially aligned. Also, the relay electrode 504b, the monitoring photodiode 505 and the blue laser diode 511 are substantially aligned.

The optical axes of respective laser lights emitted from the laser light-emitting rear end surfaces of the red laser diode 502a and the infrared laser diode 502b are present in the same plane substantially parallel to the surface of the submount 503 as well as are substantially parallel to each other in the same plane.

As shown in FIG. 10B, junctions 509a, 509b, 509c of the Au wires 506a, 506b, 506c and the relay electrodes 504a, 504b, 504c respectively has a spherical shape.

In FIGS. 10A and 10B, reference numeral 507 denotes laser light which is emitted from the laser diodes 502a, 502b, 511, reflected by the Au wires 506a, 506b, 506c and incident on the light-receiving surface of the monitoring photodiode 505. Reference numeral 508 denotes laser light which is emitted from the laser diodes 502a, 502b, 511, reflected by the junctions 509a, 509b, 509c and incident on the light-receiving surface of the monitoring photodiode 505.

According to the above embodiment, there can be decreased the amount of laser light that is emitted from the respective light-emitting rear end surfaces of the laser diodes 502a, 502b, 511 and incident on the light-receiving surface of the monitoring photodiode 505. Therefore, it is possible to accurately control an optical output of the laser diodes 502a, 502b, 511.

In the above embodiment, each of the Au wires 506a, 506b, 506c is disposed in a plane that includes each of the optical axes 510a, 510b, 510c of the laser diodes 502a, 511, 502b, to which the Au wire 506a, 506b, 506c is connected, and is perpendicular to the submount 505. Alternatively, at least one of plural (not limited to three) metal wires may be disposed in a plane that includes an optical axis of any one of plural laser diodes (not limited to three) and is substantially perpendicular to the surface of the submount. In this case, it is possible to adjust an optical output of at least one laser light. In all the cases described in the above embodiments, the gold wires are used. However, as is well known, when the wavelength becomes shorter and the color of light changes from green to blue, the reflectivity of gold decreases. In the case of the blue laser diode, therefore, it is preferred that an Al wire or an Ag wire be used in terms of reflectivity.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a one-body submount composed of a predetermined material and placed on a mounting surface;
   a laser diode placed on a front portion of an upper surface of the submount;

a monitoring photodiode composed of a crystalline silicon film and stacked on a portion of the upper surface of the submount backward from the laser diode; and wherein the submount is made of a different material than the photodiode formed thereon, so that the submount is more insulating and has a higher thermal conductivity than does the crystalline silicon film of the photodiode.

2. The semiconductor laser device according to claim 1, wherein a light-receiving surface of the monitoring photodiode has a height less than a height of a light-emitting point of the laser diode with reference to the height of the mounting surface.

3. The semiconductor laser device according to claim 1, wherein a relay electrode is placed on the upper surface of the submount away from the laser diode; and an upper electrode of the laser diode is connected to the relay electrode via a metal wire.

4. The semiconductor laser device according to claim 1, wherein the front portion of the submount is provided with a laser diode mounting electrode having substantially the same dimension as the laser diode in the front-rear direction; and a lower electrode of the laser diode is connected to the laser diode mounting electrode via a brazing material.

5. The semiconductor laser device according to claim 1, wherein the laser diode includes a one-body chip having a plurality of light-emitting points.

6. A semiconductor laser device comprising:
a one-body submount comprising a predetermined material and placed on a mounting surface;
a laser diode placed on a front portion of an upper surface of the submount;
a monitoring photodiode comprising a crystalline silicon film and stacked on a portion of the upper surface of the submount backward from the laser diode;
wherein a relay electrode is placed on the upper surface of the submount away from the laser diode; and an upper electrode of the laser diode is connected to the relay electrode via a metal wire; and
wherein the relay electrode is placed on a rear portion of the upper surface of the submount; and the metal wire is disposed along an optical axis of the laser diode in the front-rear direction.

7. A semiconductor laser device comprising:
a one-body submount comprising a predetermined material and placed on a mounting surface;
a laser diode placed on a front portion of an upper surface of the submount;
a monitoring photodiode comprising a crystalline silicon film and stacked on a portion of the upper surface of the submount backward from the laser diode; and
wherein the laser diode includes a plurality of chips that are separated from each other.

8. The semiconductor laser device according to claim 7, wherein the submount is made of an electrically insulating material having a thermal conductivity larger than that of the crystalline silicon.

9. A semiconductor laser device comprising:
a one-body submount comprising a predetermined material and placed on a mounting surface;
a laser diode placed on a front portion of an upper surface of the submount;
a monitoring photodiode comprising a crystalline silicon film and stacked on a portion of the upper surface of the submount backward from the laser diode; and
wherein the front portion of the submount is provided with a laser diode mounting electrode; and the laser diode is disposed on the laser diode mounting electrode in a state of junction down.

10. A semiconductor laser device comprising:
a first submount comprising a predetermined material and placed on a front portion of an upper surface of a mounting surface;
a laser diode placed on the first submount;
a second submount comprising a predetermined material and placed on a portion of the mounting surface backward from the first submount;
a monitoring photodiode comprising a crystalline film stacked on an upper surface of the second submount; and
wherein the second submount is made of a different material than the photodiode formed thereon, so that the second submount is more insulating and has a higher thermal conductivity than does the crystalline film of the photodiode.

11. The semiconductor laser device according to claim 10, wherein a light-receiving surface of the monitoring photodiode has a height less than a height of a light-emitting point of the laser diode with reference to the mounting surface.

12. A semiconductor laser device comprising:
a submount placed on a mounting surface;
a monitoring photodiode embedded in the submount such that a light-receiving surface of the monitoring photodiode is exposed on a side of the submount opposite to another side of the submount facing the mounting surface;
a laser diode disposed on the submount so that a laser light-emitting rear end surface of the laser diode is positioned on the side of the monitoring photodiode;
a relay electrode disposed on a portion of the submount located on an opposite side to the laser diode in relation to the monitoring photodiode; and
a metal wire connecting an electrode of the laser diode to the relay electrode, the metal wire being positioned above the light-receiving surface of the monitoring photodiode, and part of the metal wire being substantially parallel to an optical axis of laser light emitted from the laser light-emitting rear end surface of the laser diode.

13. The semiconductor laser device according to claim 12, wherein a junction of at least one of metal wires and the relay electrode connected thereto has a spherical shape.

14. The semiconductor laser device according to claim 12, wherein the metal wire intersects with the optical axis of laser light and is disposed in a plane substantially perpendicular to a surface of the submount.

15. A semiconductor laser device comprising:
a submount placed on a mounting surface;
a monitoring photodiode embedded in the submount such that a light-receiving surface of the monitoring photodiode is exposed on a side of the submount opposite to another side of the submount facing the mounting surface;
a relay electrode disposed on a portion of the submount in which portion the monitoring photodiode is not disposed;
a plurality of laser diodes disposed on a portion the submount located on an opposite side to the relay electrode in relation to the monitoring photodiode so that laser light-emitting rear end surfaces are positioned on the side of the monitoring photodiode; and a plurality of metal wires connecting respective electrodes of the plurality of laser diodes to the relay electrode, wherein all of optical axes of laser lights emitted from the respective laser light-emitting rear end surfaces of the laser diodes are present in the same plane substantially parallel to a surface of the submount, and these optical axes are parallel to one another in the same plane; and each of the plurality of metal wires intersects with an optical axis of laser light emitted from each laser diode connected to each of the metal wires, and part of each of the metal wires is disposed in a plane substantially perpendicular to the surface of the submount.

16. A semiconductor laser device comprising:

a submount placed on a mounting surface;

a monitoring photodiode embedded in the submount such that a light-receiving surface of the monitoring photodiode is exposed on a side of the submount opposite to another side of the submount facing the mounting surface;

a relay electrode disposed on a portion of the submount in which portion the monitoring photodiode is not disposed;

a plurality of laser diodes disposed on a portion of the submount located on an opposite side to the relay electrode in relation to the monitoring photodiode so that laser light-emitting rear end surfaces of the laser diodes are positioned on the side of the monitoring photodiode; and a plurality of metal wires connecting respective electrodes of the plurality of laser diodes to the relay electrode, wherein at least one of the plurality of metal wires intersects with an optical axis of laser light emitted from any one of the plurality of laser diodes and is disposed in a plane substantially perpendicular to a surface of the submount.

* * * * *